US012648261B2

(12) United States Patent
Simon et al.

(10) Patent No.: US 12,648,261 B2
(45) Date of Patent: Jun. 2, 2026

(54) METHOD OF MANUFACTURING OPTOELECTRONIC DEVICES

(71) Applicant: Commissariat à l'Énergie Atomique et aux Énergies Alternatives, Paris (FR)

(72) Inventors: Julia Simon, Grenoble (FR); Clément Ballot, Grenoble (FR); Franck Fournel, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 19/076,161

(22) Filed: Mar. 11, 2025

(65) Prior Publication Data

US 2025/0301825 A1 Sep. 25, 2025

(30) Foreign Application Priority Data

Mar. 19, 2024 (FR) ...................................... 2402720

(51) Int. Cl.
H10H 20/01 (2025.01)
H10H 29/03 (2025.01)

(52) U.S. Cl.
CPC .... H10H 20/019 (2025.01); H10H 20/01335 (2025.01); H10H 29/03 (2025.01)

(58) Field of Classification Search
None
See application file for complete search history.

(56) References Cited

U.S. PATENT DOCUMENTS

2009/0315965 A1* 12/2009 Yamagata .................. B41J 2/45
257/98
2018/0247922 A1* 8/2018 Robin .................... H01L 25/167
2018/0331153 A1* 11/2018 Robin .................... H10H 20/01
2019/0363069 A1* 11/2019 Ahmed ............... H10H 20/018
2021/0050476 A1* 2/2021 Benaissa .......... H10H 20/01335

FOREIGN PATENT DOCUMENTS

CN      107924964 A      4/2018
CN      112397449 A      2/2021
EP      3381060 B1      10/2019
EP      3780123 A1      2/2021
FR      3 044 467 A1      6/2017
(Continued)

OTHER PUBLICATIONS

Preliminary Search Report for French Application No. 2402720, dated Nov. 27, 2024.
(Continued)

*Primary Examiner* — Bradley Smith
(74) *Attorney, Agent, or Firm* — Wolf, Greenfield & Sacks, P.C.

(57) ABSTRACT

A method of manufacturing optoelectronic devices, including the following successive steps: a) forming, by epitaxial growth on a growth substrate, an active diode stack; b) transferring, onto a first transfer substrate, the active diode stack; c) removing the growth substrate; d) forming, by cutting of the first transfer substrate and of the active diode stack, a plurality of dies; and e) transferring, onto a second transfer substrate, the dies, each comprising a portion of the active diode stack.

15 Claims, 5 Drawing Sheets

(56) References Cited

FOREIGN PATENT DOCUMENTS

| FR | 3 099 966 A1 | 2/2021 |
|----|--------------|--------|
| FR | 3108777 A1 | 10/2021 |
| JP | 2018-538554 A | 12/2018 |
| JP | 7003032 B2 | 1/2022 |
| JP | 2022-025143 A | 2/2022 |
| KR | 20180088366 A | 8/2018 |
| TW | 201729396 A | 8/2017 |
| TW | 202129948 A | 8/2021 |
| WO | WO 2004/064132 A1 | 7/2004 |
| WO | WO 2017/089676 A1 | 6/2017 |

OTHER PUBLICATIONS

Abadle et al., Germanium Thin Film Manufacturing Using Covalent Bonding Process. Semicond. Sci. Technol. 2022;37:8 pages.
Sanchez et al., Collective Die Direct Bonding for Photonic on Silicon. 2018 ECS Trans., 2018;86(5):223-31.
Shimatsu et al., Atomic Diffusion Bonding of Wafers Using Various Oxide Films. Tire Technology Expo 2004; 4 pages.
Suga T., Feasibility of Surface Activated Bonding for Ultra-fine Pitch Interconnection—A New Concept of Bump-less Direct Bonding for System Level Packaging. IEEE, Electronic Components and Technology Conference. 2000;702-5.
Preliminary Search Report and Written Opinion for French Application No. FR2402720, dated Nov. 17, 2024.

* cited by examiner

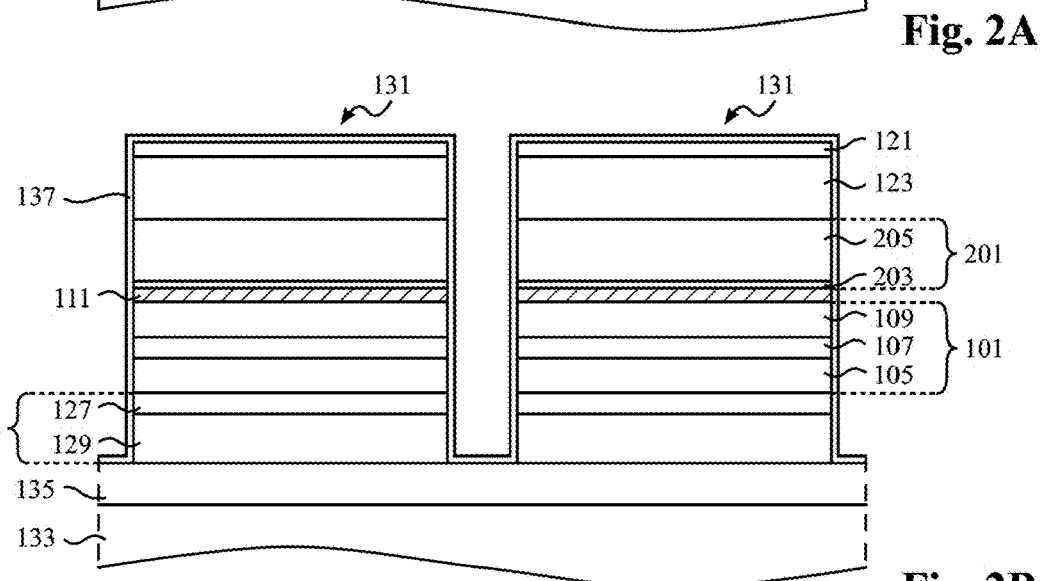
Fig. 2A
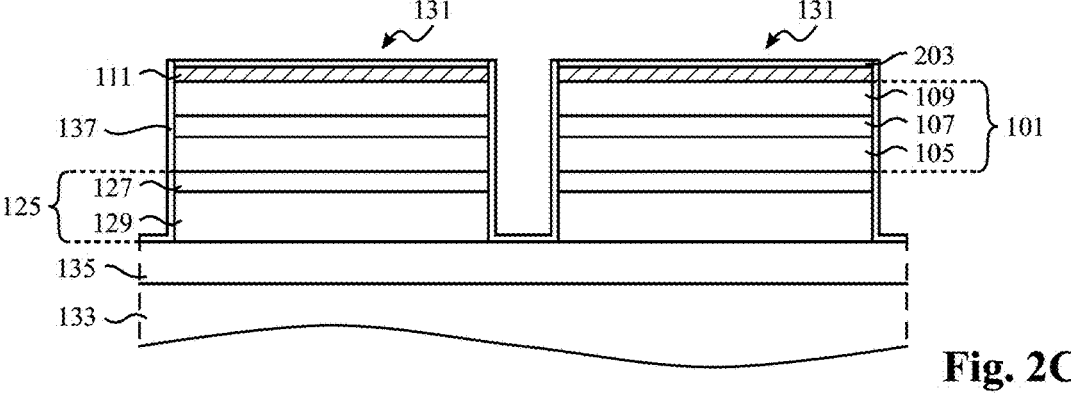
Fig. 2B
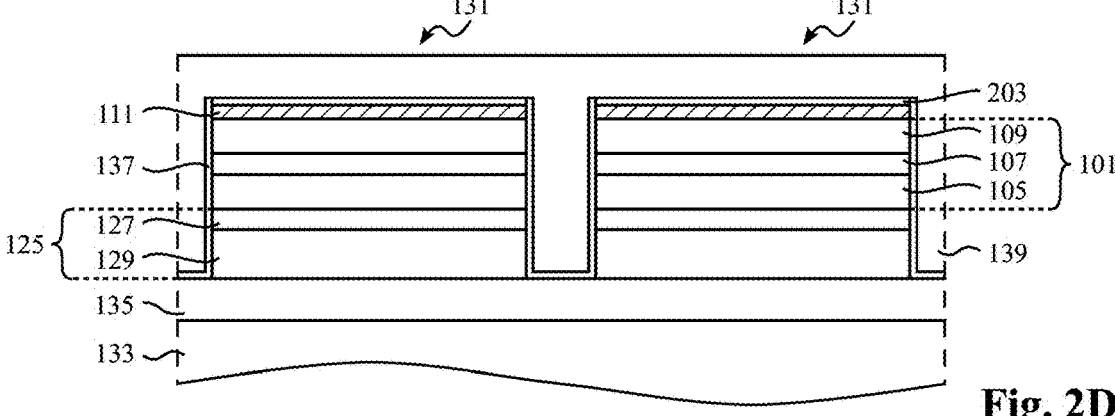
Fig. 2C
Fig. 2D

METHOD OF MANUFACTURING OPTOELECTRONIC DEVICES

CROSS REFERENCE TO RELATED APPLICATIONS

This application claims priority to French application number FR2402720, filed Mar. 19, 2024. The content of this application is incorporated by reference in its entirety.

TECHNICAL FIELD

The present disclosure generally concerns the field of optoelectronic devices. It more specifically aims at a method of manufacturing optoelectronic devices, each comprising a plurality of semiconductor diodes, for example based on gallium nitride (GaN) or on indium-gallium nitride (InGaN), and an electronic circuit for controlling these diodes.

PRIOR ART

Emissive display devices comprising an array of light-emitting diodes (LEDs) based on gallium nitride and an electronic control circuit, enabling to individually control the LEDs in order to display images, have already been provided. The use of LEDs based on gallium nitride has in particular enabled to manufacture microdisplay screens having high luminance values and resolutions.

To form such devices, it may be provided to manufacture the control circuit and the LED array separately, and then to connect them to each other. The LED array of the device can in particular be manufactured by a method comprising steps of forming of an active stack of LEDs on a substrate, of delimiting of emissive areas by photolithography, and then etching of the active LED stack, and of forming of the anode and cathode contacts of each emissive area and of metal lines connected to pads enabling to couple the anodes and cathodes of the emissive areas to the control circuit. Such methods are described in particular in International application no. WO2017/068029 and in French patent no. FR3079350 (DD18591/B16845), respectively previously filed and obtained by the applicant.

Once the LED array has been formed, it is then connected to the control circuit either by a so-called wire bonding operation, by the use of solder bumps or of metal pillars, or by hybrid bonding of the control circuit to the LED array, that is, by stacking and connecting these two elements to each other. Examples of hybrid bonding are described in the above-mentioned international application no. WO2017/068029 and French patent no. FR3079350.

However, a disadvantage of this method lies in the need to precisely align the control circuit and the LED array during the step of assembly of these two elements, so that each LED is correctly positioned on a metal pad corresponding thereto in the control circuit. This alignment is particularly difficult to achieve when the pixel pitch decreases, and is a hindrance to the increase in the resolution and/or in the pixel integration density.

To overcome this disadvantage, there has further been provided, in particular in international application no. WO2017/194845 (DD16946/B15015) previously filed by the applicant, a method of manufacturing optoelectronic devices comprising the following successive steps:

a) manufacturing the control circuit in the form of an integrated circuit comprising, on a surface, a plurality of metal pads intended to be connected to the LEDs to allow an individual control of the current flowing through each LED;

b) transferring, onto the surface of the control circuit comprising the metal pads, an active stack of LEDs extending continuously over the entire surface of the control circuit so as to connect a semiconductor layer of the active LED stack to the metal pads of the control circuit; and c) structuring the active LED stack to delimit and insulate from one another the different LEDs of the device.

An advantage of this method lies in the fact that, during the step of transfer of the active LED stack onto the control circuit, the positions of the different LEDs of the device in the active LED stack are not defined yet. The transfer step thus does not exhibit any major constraint in terms of alignment accuracy. The delimitation of the different LEDs in the active stack can then be achieved by methods of substrate structuring and of deposition of insulating and conductive layers on a substrate, which provide a much greater alignment accuracy than that which can be achieved during a transfer of one substrate onto another.

In existing methods, the active LED stack is generally formed, by epitaxial growth, on a sapphire wafer. Although this enables to form high-performance LEDs, the use of sapphire wafers however has the disadvantage of generating high manufacturing costs. Further, sapphire wafers have a diameter equal to approximately 100 or 150 mm, while the methods implemented for the forming of control circuits are better adapted to silicon wafers having a larger diameter, for example equal to approximately 300 mm. To attempt solving these problems, active stacks of gallium nitride-based LEDs have been formed on silicon substrates, for example on silicon wafers having a diameter substantially equal to that of wafers used for the forming of control circuits. However, the LEDs thus formed have, for certain emission wavelengths, in particular in green and red, performance levels lower than those obtained by using sapphire wafers.

European patent application no. EP 4016594 describes an alternative approach consisting in re-forming a wafer of large diameter by transferring, onto a first silicon wafer typically having a diameter equal to approximately 200 or 300 mm, chips obtained by cutting of a second sapphire wafer having a diameter smaller than that of the first wafer, and on which an active stack of LEDs has been previously formed. However, this approach has the disadvantage of comprising a step of cutting of the second wafer particularly complex and expensive to carry out, sapphire being a very hard material, the cutting of which causes the forming of splinters at the edge of the chip. Further, the method implements, subsequently to the transfer of the chips onto the first wafer, a step of removal of the pieces of the second wafer resulting from the previous cutting step. This removal step, carried out by laser lift-off, is difficult to control since the first wafer comprises electronic circuits, for example of CMOS (Complementary Metal-Oxide-Semiconductor) type, risking to be irreversibly damaged by exposure to a laser beam.

The layers based on gallium nitride epitaxially grown on the second wafer are also highly stressed, due to the difference in thermal expansion coefficient between sapphire and gallium nitride. During the epitaxial growth, carried out at high temperature, the layer(s) based on gallium nitride of the active LED stack are epitaxially grown on a thick gallium nitride buffer layer, allowing a lattice constant matching between the sapphire of the growth substrate and the gallium nitride of the active stack. The stress is thus progressively released within the buffer layer, so that the layers of the active LED stack are under little or no stress at the epitaxial growth temperature of these layers. During the cooling of the second wafer, the stress exerted in the buffer layer becomes highly compressive. After the pieces of the highly rigid second wafer have been removed, the stress in the gallium nitride layer is transmitted to the first wafer. This causes very large deformations of the first wafer, for example in the order of several hundreds of micrometers, accordingly making the treatment of the re-formed substrate incompatible with standard equipment of microelectronics.

European patent no. EP 3780123 (DD19602/B18565), previously obtained by the applicant, describes still another approach consisting in performing two full-plate transfers before cutting, thus avoiding cutting the sapphire, followed by a chip-to-plate transfer by non-aligned bonding of the type of that described in above-mentioned international application no. WO2017/194845.

SUMMARY OF THE INVENTION

There exists a need to overcome all or part of the disadvantages of existing optoelectronic device manufacturing methods.

For this purpose, an embodiment provides a method of manufacturing optoelectronic devices, comprising the following successive steps:
- a) forming, by epitaxial growth on a growth substrate, an active diode stack;
- b) transferring, onto a first transfer substrate, the active diode stack;
- c) removing the growth substrate;
- d) forming, by cutting of the first transfer substrate and of the active diode stack, a plurality of dies; and
- e) transferring, onto a second transfer substrate, the dies, each comprising a portion of the active diode stack.

According to an embodiment, the growth substrate or transfer substrate is heated, preferably up to a temperature higher than or equal to 40° C., more preferably higher than or equal to 70° C.

According to an embodiment, at step b), the growth substrate and the transfer substrate are heated, preferably up to a temperature higher than or equal to 40° C.

According to an embodiment, at step b), the active diode stack is bonded to the first transfer substrate by direct bonding of a first bonding layer, previously deposited on the surface of the active diode stack opposite to the growth substrate, with a second bonding layer, previously deposited on the first transfer substrate.

According to an embodiment, at step b), the surfaces of the first and second bonding layers intended to be brought into contact are activated prior to the bonding.

According to an embodiment, the first and second bonding layers are made of amorphous silicon.

According to an embodiment, the first and second bonding layers are metal layers, preferably made of titanium.

According to an embodiment, at step e), the dies are bonded to the second transfer substrate by direct bonding of a third bonding layer, previously deposited on the surface of the active diode stack opposite to the first transfer substrate, with a fourth bonding layer, previously deposited on the second transfer substrate.

According to an embodiment, the third and fourth bonding layers are made of silicon oxide.

According to an embodiment, the method further comprises, after step e), the following step:

- f) transferring the assembly comprising the second transfer substrate and the portions of the active diode stack onto an active substrate comprising integrated control circuits.

According to an embodiment, at step f), the portions of the active diode stack and the second transfer substrate are bonded to the active substrate by bonding of a first insulating layer, previously deposited on the surface of the active diode stack opposite to the second transfer substrate, and of first contacting elements, located in the first insulating layer, with respectively a second insulating layer, previously deposited on the active substrate, and second contacting elements, located in the second insulating layer.

According to an embodiment, the method further comprises, after step e), a step g) of etching of the dies so as to compensate for a misalignment of the dies with respect to the second transfer substrate.

According to an embodiment, the method further comprises, after step g), a step h) of deposition of an insulating layer filling gaps laterally extending between the dies and then of removal of portions of the insulating layer located vertically in line with the dies.

According to an embodiment, the growth substrate is made of sapphire.

According to an embodiment, the active diode stack comprises gallium nitride.

According to an embodiment, the active diode stack is a stack of light-emitting diodes comprising, in the order from the growth substrate, first and second semiconductor layers of opposite conductivity types.

BRIEF DESCRIPTION OF THE DRAWINGS

The foregoing features and advantages, as well as others, will be described in detail in the rest of the disclosure of specific embodiments given as an illustration and not limitation with reference to the accompanying drawings, in which:

FIG. 1A, FIG. 1B, FIG. 1C, FIG. 1D, FIG. 1E, FIG. 1F, FIG. 1G, FIG. 1H, FIG. 1I, FIG. 1J, FIG. 1K, FIG. 1L, and FIG. 1M are side and cross-section views, simplified and partial, illustrating structures obtained at the end of steps of an example of an embodiment of an optoelectronic device manufacturing method;

FIG. 2A, FIG. 2B, FIG. 2C, and FIG. 2D are side and cross-section views, simplified and partial, illustrating structures obtained at the end of steps of an alternative implementation of the method of FIGS. 1A to 1M.

DESCRIPTION EMBODIMENTS

Like features have been designated by like references in the various figures. In particular, the structural and/or functional features that are common among the various embodiments may have the same references and may dispose identical structural, dimensional and material properties.

For clarity, only those steps and elements which are useful to the understanding of the described embodiments have been shown and are described in detail. In particular, the applications likely to benefit from the described optoelectronic devices have not been detailed, the described embodiments being compatible with all or most applications implementing at least one optoelectronic device, possibly subject to adaptations within the abilities of those skilled in the art on reading of the present disclosure. Further, the forming of an integrated circuit for controlling semiconductor diodes has not been detailed, the described embodiments being compatible with usual structures and manufacturing methods of such control circuits. Further, the composition and the arrangement of the different layers of an active semiconductor diode stack have not been detailed, the described embodiments being compatible with usual active semiconductor diode stacks, particularly based on gallium nitride.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, where reference is made to absolute position qualifiers, such as "front", "back", "top", "bottom", "left", "right", etc., or relative position qualifiers, such as "top", "bottom", "upper", "lower", etc., or orientation qualifiers, such as "horizontal", "vertical", etc., reference is made unless otherwise specified to the orientation of the drawings.

Unless specified otherwise, the expressions "about", "approximately", "substantially", and "in the order of" signify plus or minus 10%, preferably of plus or minus 5%.

In the following description, the qualifiers "insulating" and "conductive" respectively signify, unless otherwise specified, electrically insulating and electrically conductive.

FIG. 1A, FIG. 1B, FIG. 1C, FIG. 1D, FIG. 1E, FIG. 1F, FIG. 1G, FIG. 1H, FIG. 1I, FIG. 1J, FIG. 1K, FIG. 1L and FIG. 1M are side and cross-section views, simplified and partial, illustrating structures obtained at the end of steps of an example of an embodiment of an optoelectronic device manufacturing method.

FIGS. 1A to 1M more particularly illustrate the manufacturing of an optoelectronic display device comprising an array of LEDs and an electronic control circuit enabling to individually control the LEDs in order to display images.

Figures 1A, 1B, 1C, 1D, 1E:
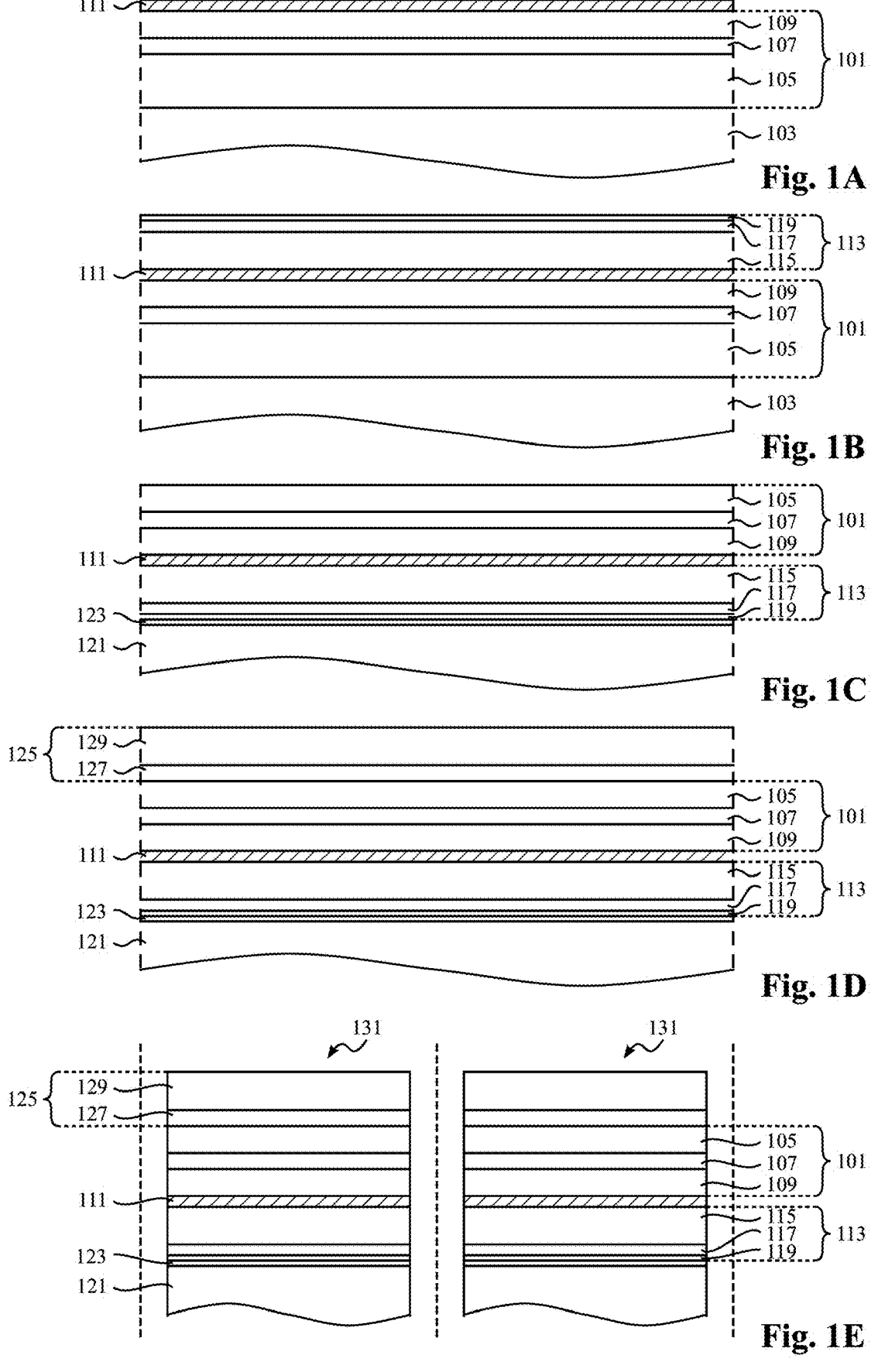

FIG. 1A illustrates a structure obtained at the end of steps of forming of an active LED stack 101 on the upper surface, in the orientation of FIG. 1A, of a growth substrate 103. Active LED stack 101 is for example based on gallium nitride (GaN).

Active LED stack 101 is formed by epitaxial growth from the upper surface of growth substrate 103. Growth substrate 103 is, for example, a wafer or a piece of wafer. Preferably, growth substrate 103 is made of sapphire. Sapphire indeed has the advantage of allowing the growth of a high-quality gallium nitride LED stack.

In the shown example, active LED stack 101 comprises, in the order from the upper surface of growth substrate 103, an N-type doped gallium nitride layer 105, an emissive layer 107, and a P-type doped gallium nitride layer 109. Emissive layer 107, or active layer, for example comprises a stack of a plurality of emissive layers forming quantum wells, for example layers based on gallium nitride, indium nitride (InN), indium-gallium nitride (InGaN), aluminum-gallium nitride (AlGaN), aluminum nitride (AlN), aluminum indium gallium nitride (AlInGaN), gallium phosphide (GaP), aluminum gallium phosphide (AlGaP), aluminum indium gallium phosphide (AlInGaP), or any combination of one or a plurality of these materials.

As a variant, emissive layer 107 may be an intrinsic, that is, non-intentionally doped, gallium nitride layer, for example having a concentration of residual donor species in the range from $10^{15}$ to $10^{18}$ at/cm$^3$, for example in the order of $10^{17}$ at/cm$^3$.

In the shown example, the lower surface of emissive layer 107 is in contact with the upper surface of layer 105, and the upper surface of emissive layer 107 is in contact with the lower surface of layer 109. In practice, a stack of one or a plurality of buffer layers (not shown), for example an undoped gallium nitride layer, may form an interface between growth substrate 103 and gallium nitride layer 105.

As an example, the thickness of layer 105 is in the range from 0.2 to 2 µm, for example in the order of 1 µm. As an example, the thickness of layer 107 is in the range from 30 to 300 nm, for example in the order of 100 nm. As an example, the thickness of layer 109 is in the range from 5 to 300 nm, for example in the order of 100 nm. Active LED stack 101 for example extends continuously and across a uniform thickness over the entire upper surface of growth substrate 103.

The structure of FIG. 1A further comprises, on the upper surface of active LED stack 101, a metal layer 111. In the shown example, metal layer 111 is deposited on top of and in contact with the upper surface of gallium nitride layer 109. Metal layer 111 is for example deposited by the implementation of a vacuum deposition technique, for example by physical vapor deposition (PVD), by vacuum sputtering, by chemical vapor deposition (CVD), or by vacuum evaporation deposition. Metal layer 111 ensures in particular a function of electrical contacting on the semiconductor layer 109 of LED stack 101. Metal layer 111 may further ensure the function of an optical reflector, or mirror and/or the function of a barrier to the diffusion of metal elements.

As an example, metal layer 111 is formed of a stack of a plurality of distinct metal layers (not detailed in the drawings) comprising, in the order from the upper surface of semiconductor layer 109:

a first metal layer, for example made of a transparent and conductive oxide such as indium tin oxide (ITO), in contact with the upper surface of semiconductor layer 109 and providing an electrical contact on semiconductor layer 109;

a second metal layer, for example made of titanium nitride (TiN), in contact with the upper surface of the first metal layer, the second metal layer forming a barrier to the diffusion of metal elements; and a third metal layer, for example made of aluminum, in contact with the upper surface of the second metal layer, the third metal layer having an optical reflector function.

The thickness of the first metal layer is for example adjusted so that the distance between the quantum well of emissive layer 107 closest to layer 109 and the upper surface of the second metal layer enables to obtain constructive interference for the light in the structure. This thus allows an optimum extraction of light.

As an example, the first metal layer has a thickness in the range from 20 to 100 nm, for example equal to approximately 60 nm. As an example, the second metal layer has a thickness in the range from 1 to 10 nm, for example equal to approximately 5 nm. As an example, the third metal layer has a thickness in the range from 100 to 200 nm, for example equal to approximately 100 nm.

As a variant, metal layer 111 may be formed of any stack of layers made of a transparent and conductive oxide, for example ITO, and/or of layers based on a metal, on a metal alloy, or on a metal oxide, for example based on nickel, nickel oxide, nickel aluminide, aluminum, silver, platinum, etc.

FIG. 1B illustrates a structure obtained at the end of a subsequent step of forming of a bonding stack 113 on the upper surface of the metal layer 111 of the structure of FIG. 1A.

Bonding stack 113 is for example selected to allow a hot bonding by using a surface activated bonding (SAB) process or an atomic diffusion bonding (ADB) technique, and a subsequent removal of the material used for the bonding without damaging semiconductor layer 109. As an example, the subsequent removal of the material used for the bonding may be carried out by wet etching processes, for example by exposure to hydrofluoric acid and/or to nitric acid, or by dry etching, for example by deep reactive ion etching (DRIE) by using for example sulfur hexafluoride ($SF_6$).

As an example, bonding stack 113 comprises, in the order from the upper surface of metal layer 111, an insulating layer 115, an optional silicon nitride (SiN) layer 117, and a bonding layer 119. In the illustrated example, the lower surface of layer 117 is in contact with the upper surface of layer 115, and the upper surface of layer 117 is in contact with the lower surface of layer 119. Layer 115 for example comprises at least one layer made of an oxide, of a nitride, or of an oxynitride. As an example, layer 115 is made of silicon oxide ($SiO_2$), of silicon nitride, or of silicon oxynitride (SiON). As a variant, layer 115 may be an etch stop layer for example formed of a titanium layer, for example having a thickness in the order of 10 nm, coated with a titanium nitride layer, for example having a thickness in the order of 50 nm.

Bonding layer 119 is for example made of amorphous silicon (a-Si).

As an example, layer 115 has a thickness in the range from 300 and 600 nm. For example, layer 117 has a thickness of the order of 200 nm. For example, layer 119 has a thickness of the order of 20 nm.

FIG. 1C illustrates a structure obtained at the end of subsequent steps of transfer and of bonding of active LED stack 101 to the upper surface of a temporary transfer substrate 121, or handle, and then of removal of growth substrate 103.

Beforehand, a bonding layer 123 is for example formed on the upper surface, in the orientation of FIG. 1C, of temporary transfer substrate 121. Substrate 121 is for example a wafer or a piece of wafer made of a semiconductor material, for example silicon. Substrate 121 for example has lateral dimensions substantially equal to those of growth substrate 103.

Bonding layer 123 is for example made of the same material as bonding layer 119, for example of amorphous silicon. Bonding layer 123 for example has a thickness substantially identical to that of bonding layer 119, for example in the order of 20 nm. Bonding layer 123 for example extends continuously over the entire upper surface of substrate 121. According to a desired surface condition, bonding layer 123 may be submitted to a planarizing operation prior to the transfer step.

During the transfer step, the assembly comprising growth substrate 103, active LED stack 101, metal layer 111, and bonding stack 113 may be flipped and transferred onto temporary transfer substrate 121 so as to place the upper surface (in the orientation of FIG. 1B) of bonding layer 119 into contact with the upper surface of bonding layer 123. In this example, the bonding of active LED stack 101 to temporary transfer substrate 121 is obtained by direct bonding of the lower surface (in the orientation of FIG. 1C) of bonding layer 119 to the upper surface of bonding layer 123. The expression "direct bonding" here signifies that the bonding is a spontaneous bonding without the presence of a fluid layer, for example an adhesive layer, at the surface. Although it is a spontaneous bonding, a pressure may be applied at the time of the bonding.

As an example, the bonding is more specifically a covalent bonding under ultra-high vacuum with a control of the temperature of substrates 103 and 121. The surfaces intended to be brought into contact are for example activated beforehand, for example by bombardment with argon atoms having an energy in the order of 200 eV to reach a dose in the order of $10^{15}$ at/cm$^2$. This activation is for example achieved by the implementation of the above-mentioned SAB technique. As a variant, the surface-activated bonding (SAB) may be replaced by an atomic diffusion bonding (ADB) with an ultra-high-vacuum deposition of amorphous silicon of small thickness, for example in the range from 1 to 10 nm. This layer can advantageously replace the layer previously deposited on the surfaces.

Prior to the placing into contact of the two bonding surfaces, at least one of the substrates—among the growth substrate 103 and temporary transfer substrate 121—is for example heated. As an example, one of substrates 103, 121 is heated up to a temperature higher by approximately 20° C. or approximately 50° C. than room temperature, for example a temperature higher than or equal to 40° C. or higher than or equal to 70° C. In a case where growth substrate 103 has a thermal expansion coefficient greater than that of layer 105 and where layer 105 has a thermal expansion coefficient greater than that of temporary transfer substrate 121, substrates 103 and 121 are advantageously heated up to different temperatures, the heating temperature of substrate 103 being, for example, greater than that of substrate 121. The fact of heating growth substrate 103 enables to relax the stress in layer 105, since this enables to approach the growth temperature. Once the bonding has taken place and the structure has cooled to room temperature, the difference in thermal expansion coefficient between the materials of substrate 121 and of substrate 103 causes an increase in the stress in substrates 103 and 121. At the end of the step of removal of growth substrate 103, layer 105 will be less stressed, thus causing less deformation of transfer substrate 121 due to the difference in thermal expansion coefficient between layer 105 and temporary transfer substrate 121. The selection of the temperatures to which are taken substrates 103 and 121 prior to the bonding is for example conditioned by the search for a compromise between two objectives:

preserving the integrity of the structure when it is returned to room temperature, because if excessive stress is imposed between substrate 121 and substrate 103, it is possible to reach the breaking point of the materials; and obtaining a slight bow of transfer substrate 121 after removal of growth substrate 103, for example smaller than 100 or 120 μm, so as to enable the processing of the structure by standard equipment of microelectronics, in particular dry etching equipment of RIE (Reactive Ion Etching) or ICP (Inductively Coupled Plasma) type.

As an example, in the case where substrate 103 has a thermal expansion coefficient greater than that of layer 105 and where layer 105 has a thermal expansion coefficient greater than that of substrate 121, growth substrate 103 is heated up to a temperature in the range from 95 to 150° C., and transfer substrate 121 is heated up to a temperature in the order of 40° C. As a variant, transfer substrate 121 may not be heated and may for example be maintained at room temperature, for example at approximately 20° C. Depending on the materials forming substrates 103 and 121, transfer substrate 121 may as a variant be heated up to a temperature higher than that of growth substrate 103, in which case the growth substrate may or may not be heated. This corresponds, for example, to a case in which substrate 103 has a thermal expansion coefficient lower than that of substrate 121.

As a variant, growth substrate 103 and temporary transfer substrate 121 are heated, for example, up to a temperature approximately 20 or 25° C. higher than room temperature. As an example, substrates 103 and 121 are each heated up to a temperature higher than or equal to 40 or 45° C.

The removal of growth substrate 103 is for example carried out by the implementation of a laser lift-off (LLO) technique, during which a laser beam is projected through substrate 103 from its surface opposite to active LED stack 101. In the case where temporary transfer substrate 121 is warped as a result of the transfer and of the bonding of active LED stack 101, the laser beam is for example controlled to perform a spiral scan rather than a raster scan. The laser peeling step is for example followed by a step of removal of gallium bumps formed on the upper surface of layer 105 under the action of the laser, for example by wet treatment with hydrochloric acid or hot water.

In the shown example, layer 105 has been thinned, for example by RIE or ICP on its upper surface side, in the orientation of FIG. 1C.

FIG. 1D illustrates a structure obtained at the end of subsequent steps of forming of another bonding stack 125 on the upper surface of the semiconductor layer 105 of the structure of FIG. 1C.

As an example, bonding stack 125 comprises, in the order from the upper surface of semiconductor layer 105, an etch stop layer 127, for example made of silicon nitride, and a bonding layer 129, for example made of silicon oxide. In the shown example, the lower surface of layer 127 is in contact with the upper surface of layer 105, and the upper surface of layer 127 is in contact with the lower surface of layer 129. As an example, etch stop layer 127 has a thickness equal to approximately 150 nm. As an example, bonding layer 129 has a thickness in the order of 600 nm.

Further, during this step, the upper surface of bonding layer 129 is for example planarized, for example by CMP (Chemical and Mechanical Polishing).

FIG. 1E illustrates a structure obtained after a subsequent step of cutting of the structure of FIG. 1D into a plurality of dies 131. More specifically, the assembly comprising temporary transfer substrate 121, bonding layer 123, bonding stack 113, metal layer 111, active LED stack 101, and bonding stack 125 is cut into a plurality of dies 131.

In the shown example, each die 131 comprises portions of temporary transfer substrate 121, of bonding layer 123, of bonding stack 113, of metal layer 111, of active LED stack 101, and of bonding stack 125. As an example, the cutting of dies 131 is performed by sawing. Dies 131 for example have identical dimensions.

Advantageously, a preliminary step of inspection of the structure of FIG. 1D may be provided to detect epitaxial defects. The cutting may then be carried out in such a way as to concentrate defects so as to subsequently select dies 131 having low defect rates.

Figures 1F, 1G, 1H, 1I:
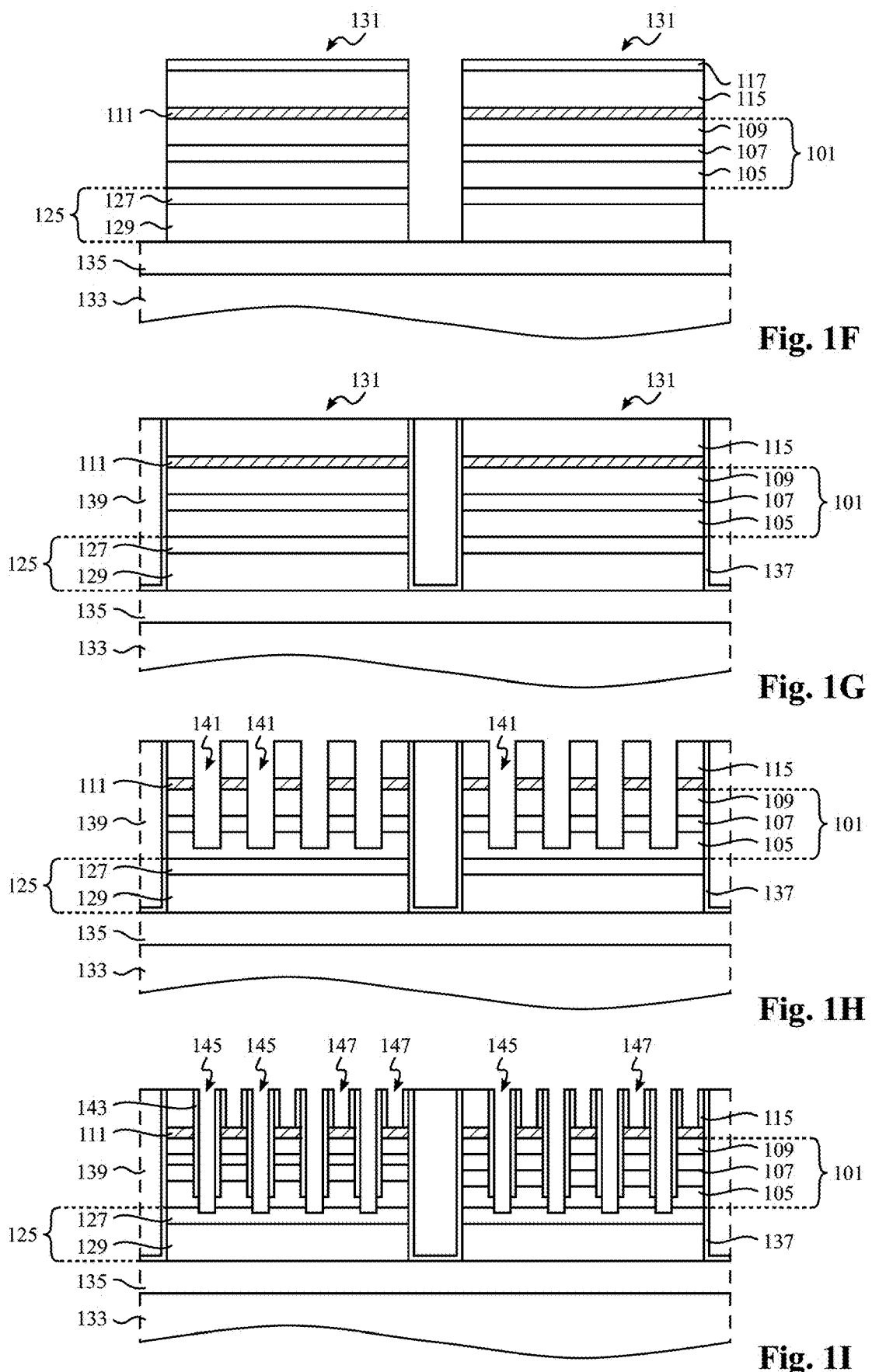

FIG. 1F illustrates a structure obtained at the end of subsequent steps of transfer and of bonding of dies 131 to the upper surface of a temporary transfer substrate 133, or handle, and then of removal of temporary transfer substrate 121 and of bonding layers 119 and 123.

Beforehand, a bonding layer 135 is for example formed on the upper surface, in the orientation of FIG. 1F, of temporary transfer substrate 133. Substrate 133 is, for example, a wafer or a piece of wafer made of a semiconductor material, for example of silicon. Substrate 133 for example has lateral dimensions greater than those of growth substrate 103.

Bonding layer 135 is for example made of the same material as bonding layer 129, for example of silicon oxide. Bonding layer 135 for example has a thickness substantially identical to or lower than that of bonding layer 129, for example in the order of 200 nm. Bonding layer 135 extends for example continuously over the entire upper surface of substrate 133.

During the transfer step, dies 131 may be flipped and transferred onto temporary substrate 133 so as to bring the lower surface (in the orientation of FIG. 1F) of bonding layer 129 into contact with the upper surface of bonding layer 135. In this example, the bonding of active LED stack 101 to temporary transfer substrate 133 is obtained by direct bonding of the lower surface (in the orientation of FIG. 1F) of bonding layer 129 to the upper surface of bonding layer 135. The direct bonding of dies 131 to temporary transfer substrate 133 is, for example, a molecular bonding, a thermocompression bonding, or also a eutectic bonding.

The portions of transfer substrate 121 and of bonding layers 119 and 123 comprised in each die 131 are then for example removed by grinding.

FIG. 1G illustrates a structure obtained at the end of subsequent steps of deposition of an encapsulation layer 137, of deposition of an insulating passivation layer 139, and of planarization of the structure.

In the shown example, encapsulation layer 137 is deposited on the upper surface side of the structure of FIG. 1F. In this example, layer 137 coats the lateral surfaces and the upper surfaces of dies 131. Layer 137 then is, after the deposition, for example, more specifically located on top of and in contact with the upper surfaces of the portions of layer 117 (or of layer 115, in the case where layer 117 is omitted) and on top of and in contact with the lateral surfaces of bonding stack 125, of active LED stack 101, of metal layer 111, of layer 115, and of layer 117. Encapsulation layer 137 is for example intended to protect the lateral surfaces of dies 131 from infiltrations of liquids used during subsequent wet etching steps.

As an example, the encapsulation layer is made of silicon nitride.

In the shown example, insulating passivation layer 139 is then deposited over the entire upper surface of the structure. Layer 139 is for example deposited over a thickness greater than the cumulated thickness of bonding stack 125, of active LED stack 101, of metal layer 111, of layer 115, and of layer 117. Layer 139 is for example made of an oxide, for example silicon oxide. As an example, layer 139 has a thickness in the order of a few micrometers, for example equal to approximately 3 or 4 μm. Layer 139 is for example then planarized, for example by CMP, so as to obtain an assembly having a substantially planar upper surface. The planarization is for example carried out with a stop on layer 117. Layer 117 is for example then removed by etching. As an example, at the end of the planarization step, the upper surface of insulating layer 115 is flush with the upper surface of insulating passivation layer 139.

FIG. 1H illustrates a structure obtained at the end of a subsequent step of delimitation and of individualization of a plurality of elementary LEDs in each die 131.

In the shown example, trenches 141 are formed in LED stack 101. In this example, each trench extends vertically, from the upper surface of insulating layer 115, through conductive layer 111, through semiconductor layers 109 and 107, and stops across the thickness of layer 105. As an example, trenches 141 are formed by etching by using the material of layer 115 as a hard mask.

FIG. 1I illustrates a structure obtained at the end of subsequent steps of deposition of another insulating passivation layer 143 and of forming of trenches 145 and of vias 147.

In the shown example, insulating passivation layer 143 is deposited over the entire upper surface of the structure. Layer 143 is for example conformally deposited in trenches 141, for example by a method of ALD (Atomic Layer Deposition) or PECVD (Plasma-Enhanced Chemical Vapor Deposition) type. Layer 143 is for example made of an oxide, for example aluminum oxide, of a nitride, for example silicon nitride or aluminum nitride, or of a stack of layers made of these materials. Layer 143 is then anisotropically etched so as to expose the bottom of trench 141, for example by dry etching of RIE or ICP type.

In the shown example, trenches 145 are formed in the extension of the previously-formed trenches 141. Trenches 145 have lateral dimensions smaller than those of trenches 141, the lateral walls of each trench 145 being formed by portions of insulating passivation layer 143. In the illustrated example, each trench 145 extends vertically, from the upper surface of insulating layer 115, through conductive layer 111, through semiconductor layers 109, 107, and 105, and stops across the thickness of layer 127 of bonding stack 125. Trenches 145 enable, among others, to insulate the portion of the semiconductor layer 105 of each elementary LED from the portions of the layer 105 of the other LEDs.

In the shown example, vias 147 have a depth smaller than that of trenches 145. Vias 147 extend vertically, from the upper surface of layer 115, across the entire thickness of layer 115. In the shown example, the bottom of each via 147 is formed by a portion of the upper surface of conductive layer 111.

Figures 1J, 1K, 1L, 1M:
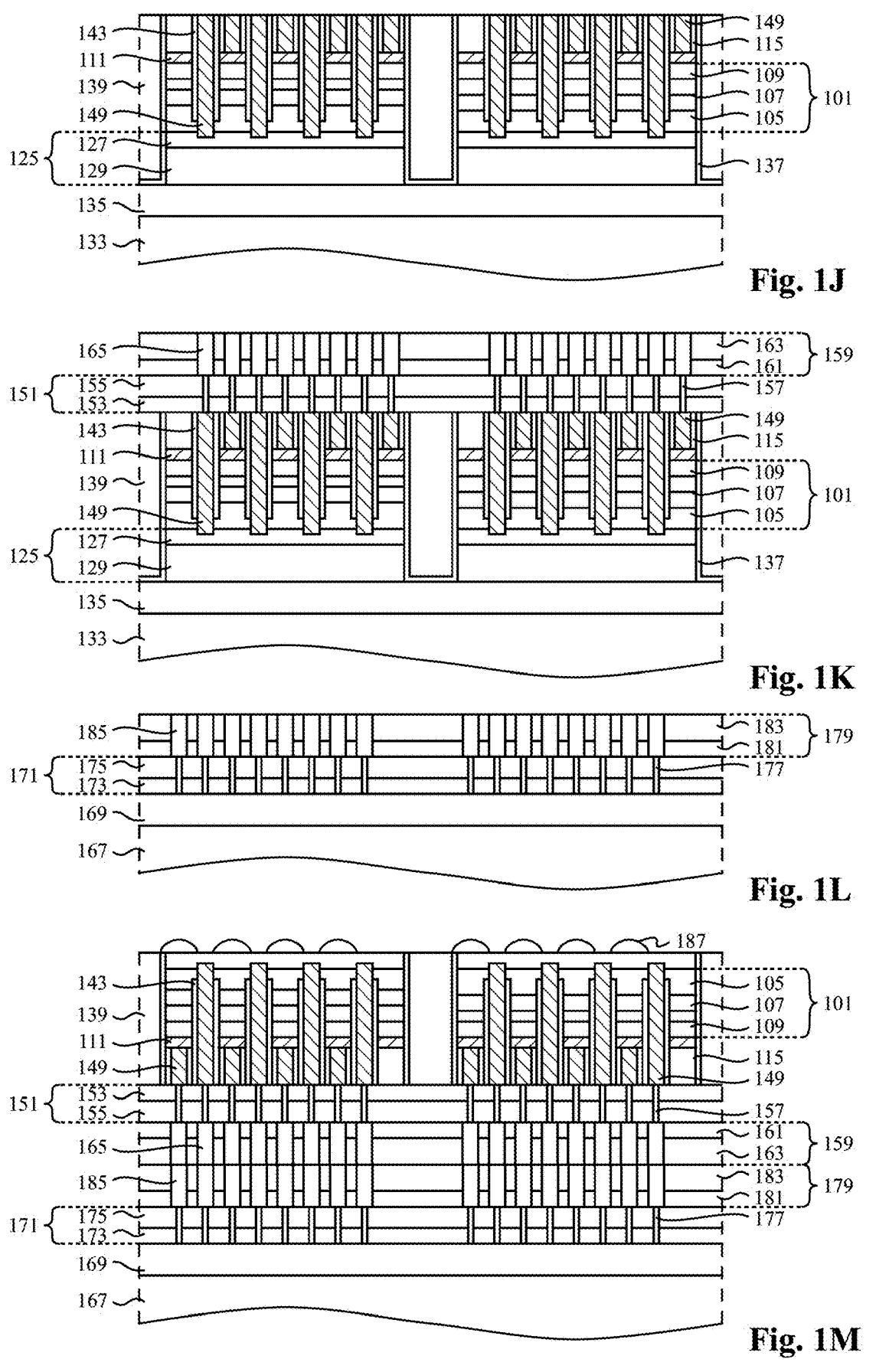

FIG. 1J illustrates a structure obtained at the end of a subsequent step of forming of conductive regions 149 within trenches 145 and vias 147. In the shown example, regions 149 fill trenches 145 and vias 147.

As an example, regions 149 are formed by successive depositions, on the upper surface side of the assembly:
- of at least one mirror layer extending on top of and in contact with the lateral surfaces and the bottom of trenches 145 and of vias 147;
- of at least one seed layer extending on top of and in contact with the mirror layer; and
- of at least one filling layer.

As an example, the mirror layer is an aluminum layer or a titanium layer coated with an aluminum layer. As an example, the seed layer is formed of a stack of a plurality of layers comprising, in the order from the mirror layer, a titanium layer, a titanium nitride layer, and a copper layer. As an example, the filling layer is made of a metal, for example copper, or of a metal alloy.

Regions 149 are for example formed by a damascene-type process. The mirror layer is for example formed by ion beam deposition (IBD) or by physical vapor deposition. The filling layer is for example formed by electrochemical deposition.

The filling layer is for example deposited over the entire upper surface of the assembly, across a thickness sufficient to fill trenches 145 and vias 147. A step of planarization of upper surface of the assembly, for example by chemical-mechanical polishing, is then for example implemented so that regions 149 are flush with the upper surfaces of the portions of layer 115.

FIG. 1K illustrates a structure obtained at the end of subsequent steps of forming of a stack 151 of insulating layers 153 and 155 on the upper surface of the structure of FIG. 1J, of forming of through conductive vias 157 in stack 151, of forming of a stack 159 of insulating layers 161 and 163 on stack 151, and of forming of contacting elements 165 in stack 159.

As an example, insulating layers 153 and 155 are respectively made of silicon nitride and of silicon oxide. Conductive vias 157 are for example made of a metal, for example copper, or of a metal alloy. Conductive vias 157 are for example formed by the implementation of a damascene-type process. Conductive vias 157 for example enable to perform an adjustment of the proportion of conductive material on the upper surface of the assembly. In the shown example, each conductive via 157 extends vertically across the entire stack 151, and is located on top of and in contact with the upper surface of one of regions 149.

As an example, insulating layers 161 and 163 are respectively made of silicon nitride and of silicon oxide. Contacting elements 165 are for example formed by the implementation of a damascene-type process, for example of the type described in French patent no. FR3079350 (DD18591/B16845), previously obtained by the applicant. Contacting elements 165 are for example made of a metal, for example copper, or of a metal alloy. In the shown example, each contacting element 165 extends vertically through the entire stack 159, and is located on top of and in contact with the upper surface of one of conductive vias 157.

FIG. 1L illustrates a structure obtained at the end of steps of forming, on a surface of a substrate 167 comprising an active region 169, of a stack 171 of insulating layers 173 and 175, of forming of through conductive vias 177 in stack 171, of forming of a stack 179 of insulating layers 181 and 183 on stack 171, and of forming of contacting elements 185 in stack 179.

Substrate 167 is, for example, a wafer or a piece of wafer made of a semiconductor material, for example silicon. The active region 169 of substrate 167 comprises, for example, a plurality of integrated control circuits. The control circuits, not detailed in FIG. 1L for the sake of readability, are for example formed in CMOS (Complementary Metal-Oxide-Semiconductor) technology. The control circuits formed in active region 169 are, for example, of ASIC (Application-Specific Integrated Circuit) type. As an example, substrate 167 has lateral dimensions greater than those of growth substrate 103.

Stacks 171 and 179 are, for example, similar or identical to stacks 151 and 159, respectively. Further, conductive vias 177 and contacting elements 185 are, for example, similar or identical to conductive vias 157 and to contacting elements 165, respectively.

FIG. 1M illustrates a structure obtained at the end of subsequent steps of transfer and of bonding of the assembly of FIG. 1K to the assembly of FIG. 1L. During this step, the assembly comprising temporary transfer substrate 133, layer 135, stack 125, stack 101, layer 111, layer 115, and stacks 151 and 159 may be flipped with respect to the orientation of FIG. 1K so as to bond the surface of LED stack 101 opposite to substrate 133 to the upper surface of substrate 167. The lower surface of insulating layer 163 and the lower surfaces of contacting elements 165, in the orientation of FIG. 1M, may be respectively bonded to the upper surface of insulating layer 183 and to the upper surfaces of contacting elements 185. In this example, the bonding of active LED stack 101 to substrate 167 is obtained by direct bonding of the surfaces brought into contact, for example more specifically by hybrid metal-to-oxide bonding. As an example, an anneal operation, for example at a temperature equal to approximately 400° C. and for a duration in the order of 2 h, is then implemented so as to consolidate the bonding.

At the end of the transfer step, the individual LEDs previously delimited in active LED stack 101 are connected to the electronic control circuits formed in the active region 169 of substrate 167.

Once active LED stack 101 has been bonded to the upper surface of substrate 167, temporary transfer substrate 133 is removed, for example by grinding and then wet etching with a selective stop on the material of layer 135.

A chemical-mechanical polishing step is for example then implemented on the upper surface side of the assembly so as to remove layers 135 and 129. As an example, the chemical-mechanical polishing is carried out with a stop on layer 127.

A passivation layer (not shown), for example made of silicon nitride, is then for example deposited on the upper surface side of the assembly, and microlenses 187 are formed vertically in line with each elementary LED of the optoelectronic display device. As an example, microlenses 187 are made of an insulating material, for example silicon nitride or gallium nitride.

An advantage of the method described in relation with FIGS. 1A to 1M lies in the fact that it comprises no step of cutting of growth substrate 103 into dies or chips. This is particularly advantageous in the case where growth substrate 103 is made of sapphire, which material is very difficult to cut.

Another advantage of the method described in relation with FIGS. 1A to 1M lies in the fact that the step of removal of growth substrate 103 is carried out prior to the transfer of active LED stack 101 onto the semiconductor substrate 167 inside and on top of which the control circuits are integrated. This enables, in the case where this removal is implemented by projection of a laser beam through substrate 103, for example during a laser peeling step, not to risk damaging the control circuits.

Still another advantage of the method described in relation with FIGS. 1A to 1M lies in the fact that it enables to obtain an optimal optical configuration in terms of light extraction, in particular due to the presence of LEDs with a resonant cavity, to slopes in the gallium nitride favorable to the extraction of light towards the outside environment, and to the possibility of making the microlenses from gallium nitride.

FIG. 2A, FIG. 2B, FIG. 2C, and FIG. 2D are side and cross-section views, simplified and partial, illustrating structures obtained at the end of steps of an alternative implementation of the method of FIGS. 1A to 1M. The variant of FIGS. 2A to 2D for example generally corresponds to a case in which the first bonding is a metal-to-metal bonding.

FIG. 2A illustrates a structure obtained at the end of a step of forming of a bonding stack 201 on the upper surface of the metal layer 111 of the structure of FIG. 1A.

In the shown example, bonding stack 201 comprises, in the order from the upper surface of metal layer 111, a layer 203 made of metal nitride, for example, titanium nitride (TiN), and a bonding layer 205 made of metal, for example titanium. In the shown example, the lower surface of layer 203 is in contact with the upper surface of metal layer 111, and the upper surface of layer 203 is in contact with the lower surface of layer 205.

As an example, layer 203 has a thickness in the order of 40 nm. As an example, layer 205 has a thickness in the order of 600 nm.

Although this has not been illustrated in FIG. 2A to avoid overloading the drawing, another layer may be interposed between layers 203 and 205 to form a stop layer during a subsequent step of removal of layer 205.

During subsequent steps, for example similar to the steps previously described hereabove in relation with FIGS. 1C to 1E:

the structure of FIG. 2A is for example flipped and then transferred onto temporary transfer substrate 121, the bonding layer 123 coating substrate 121 being in this case made of metal, for example of titanium;

growth substrate 103 is removed and bonding stack 125 is formed on active LED stack 101; and the assembly is cut to obtain dies 131.

FIG. 2B illustrates a structure obtained at the end of subsequent steps of transfer and of bonding of dies 131 to the upper surface of temporary transfer substrate 133, of removal of part of the thickness of temporary transfer substrate 121 and of deposition of encapsulation layer 137.

The transfer of dies 131 onto the upper surface of temporary transfer substrate 133 is for example performed similarly or identically to what has been described hereabove in relation with FIG. 1F. As an example, the partial removal of temporary transfer substrate 121 is performed by grinding. Encapsulation layer 137 is for example deposited over the entire upper surface of the structure, for example as previously described in relation with FIG. 1G.

FIG. 2C illustrates a structure obtained at the end of subsequent steps of removal of the entire temporary transfer substrate 133 and of removal of bonding layers 123 and 207.

Temporary transfer substrate 133 is for example removed by grinding. As an example, bonding layers 123 and 207 are removed by etching, for example by wet etching, with a stop on metal nitride layer 203.

FIG. 2D illustrates a structure obtained at the end of subsequent steps of deposition of passivation layer 139.

The forming of passivation layer 139 is for example, similar or identical to what has been previously described in relation with FIG. 1G, and will not be detailed again hereafter.

Subsequent steps similar or identical to those previously described in relation with FIGS. 1H to 1M are then for example implemented from the assembly of FIG. 2D.

The variant of FIGS. 2A to 2D for example has advantages similar or identical to those of the method of FIGS. 1A to 1M.

FIG. 3A, FIG. 3B, FIG. 3C, and FIG. 3D respectively are top views and side and cross-section views, simplified and partial, illustrating structures obtained at the end of steps of another alternative implementation of the method of FIGS. 1A to 1M. The variant of FIGS. 3A to 3D for example generally corresponds to a case in which the transfer of dies 131 onto temporary transfer substrate 133 is carried out by means of a water film.

Figures 3A, 3B, 3C, 3D:
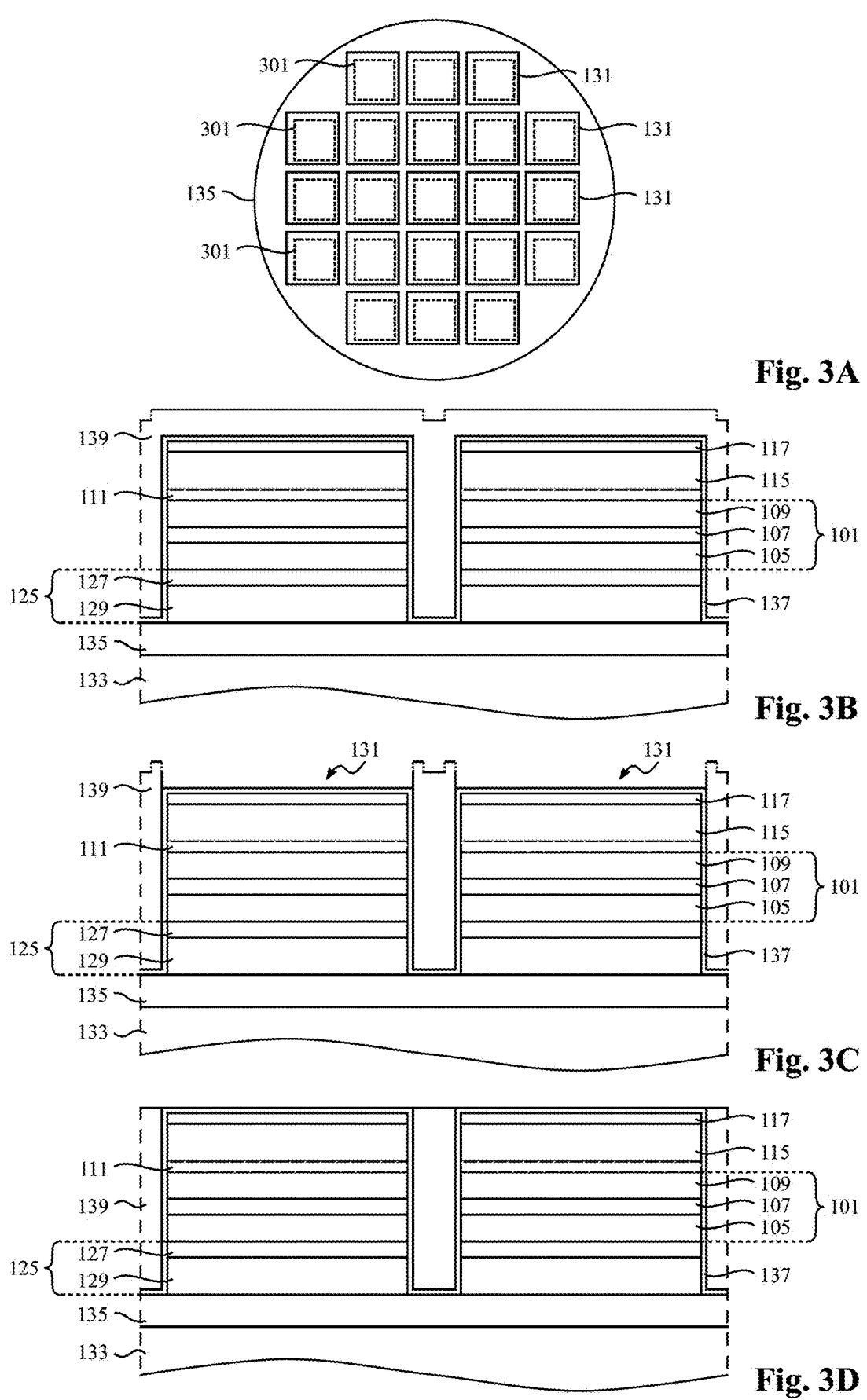
FIG. 3A, FIG. 3B, FIG. 3C, and FIG. 3D respectively are side and cross-section views, simplified and partial, illustrating structures obtained at the end of steps of another alternative implementation of the method of FIGS. 1A to 1M.

FIG. 3A illustrates a structure obtained at the end of a step of transfer and of bonding of dies 131 to the bonding layer 135 coating temporary transfer substrate 133. As an example, dies 131 are obtained according to the steps of the method described hereabove in relation with FIGS. 1A to 1E.

The transfer of dies 131 is for example performed by the implementation of a water film bonding technique, for example such as described in European patent application no. EP 3593376 previously filed by the applicant.

In the shown example, dies 131 have, in top view, a substantially square general shape. This example is however not limiting, and dies 131 may, as a variant, have any general shape, for example rectangular, oval, circular, etc.

At the end of the transfer and bonding step, dies 131 are, for example, laterally and/or angularly misaligned with respect to desired positions of dies 131. To overcome this problem, dies 131 are for example etched so as to obtain dies 301 aligned with the desired positions. To be able to implement this misalignment correction, it is, for example, provided for dies 131 to have lateral dimensions greater than those of the desired dies 301 after the transfer onto temporary transfer substrate 133.

FIG. 3B illustrates a structure obtained after subsequent steps of deposition of encapsulation layer 137 and of deposition of insulating passivation layer 139, for example as previously discussed in relation with FIG. 1G.

FIG. 3C illustrates a structure obtained after a subsequent step of structuring of insulating passivation layer 139, for example by photolithography followed by etching vertically in line with each die 131.

In the shown example, layer 139 is removed vertically in line with each die 131 so as to expose the upper surface (in the orientation of FIG. 3C) of the layer 137 located on each die 131.

FIG. 3D illustrates a structure obtained at the end of a subsequent step of planarization of the structure of FIG. 3C on the upper surface side (in the orientation of FIG. 3D) of temporary transfer substrate 133.

In the shown example, at the end of this step, the upper surface of insulating passivation layer 139 is flush with the upper surfaces of dies 131, more specifically the upper surfaces of the portions of layer 137 coating each die. As an example, the planarization step is carried out by chemical-mechanical polishing, for example with a stop on layer 137.

The variant of FIGS. 3A to 3D, for example, has advantages similar or identical to those of the method of FIGS. 1A to 1M.

Another advantage of the variant described hereabove in relation with FIGS. 3A to 3D lies in the fact that it enables to greatly improves the planarity of the assembly, which is a key element for the subsequent implementation of the hybrid bonding to substrate 167.

Subsequent steps similar or identical to those previously described in relation with FIGS. 1H to 1M are for example then carried out from the assembly of FIG. 1G.

Various embodiments and variants have been described. Those skilled in the art will understand that certain features of these various embodiments and variants may be combined, and other variants will occur to those skilled in the art. In particular, the variant of FIGS. 2A to 2D and the variant of FIGS. 3A to 3D may be combined.

Further, the conductivity types of semiconductor layers 105 (N-type, in the described examples) and 109 (P-type, in the described examples) may be reversed.

Further, although examples of embodiment of display devices comprising LEDs based on gallium nitride have been detailed, the described embodiments may be adapted by those skilled in the art to the manufacturing of a device comprising a plurality of photodiodes based on gallium nitride individually-addressable to acquire images.

More generally, the described embodiments may be adapted to the manufacturing of any display device or photosensitive sensor based on semiconductor diodes, including those based on semiconductor materials other than gallium nitride, for example diodes based on other III-V semiconductor materials.

The described embodiments may further be adapted to the manufacturing of any electronic device comprising a plurality of semiconductor components based on gallium nitride or based on other semiconductor materials, for example, III-V materials, and an integrated circuit adapted to individually controlling these components. As an example, the semiconductor components may be power components, for example transistors, diodes, etc.

Finally, the practical implementation of the described embodiments and variants is within the abilities of those skilled in the art based on the functional indications given hereabove. In particular, the described embodiments are not limited to the specific examples of materials and of dimensions mentioned in the present disclosure.

The invention claimed is:

1. Method of manufacturing optoelectronic devices, comprising the following successive steps:
    a) forming, by epitaxial growth on a growth substrate, an active diode stack;
    b) transferring, onto a first transfer substrate, the active diode stack;
    c) removing the growth substrate;
    d) forming, by cutting of the first transfer substrate and of the active diode stack, a plurality of dies;
    e) transferring, onto a second transfer substrate, the dies each comprising a portion of the active diode stack,
    f) removing portions of the first transfer substrate comprised in each die; and
    g) transferring the assembly comprising the second transfer substrate and the portions of the active diode stack onto an active substrate comprising integrated control circuits.

2. Method according to claim 1, wherein, at step b), the growth substrate or the transfer substrate is heated, preferably up to a temperature higher than or equal to 40° C., more preferably higher than or equal to 70° C.

3. Method according to claim 1, wherein, at step b), the growth substrate and the transfer substrate are heated, preferably up to a temperature higher than or equal to 40° C.

4. Method according to claim 1, wherein, at step b), the active diode stack is bonded to the first transfer substrate by direct bonding of a first bonding layer, previously deposited on the surface of the active diode stack opposite to the growth substrate, with a second bonding layer, previously deposited on the first transfer substrate.

5. Method according to claim 4, wherein, at step b), the surfaces of the first and second bonding layers intended to be brought into contact are activated prior to bonding.

6. Method according to claim 4, wherein the first and second bonding layers are made of amorphous silicon.

7. Method according to claim 4, wherein the first and second bonding layers are metal layers, preferably made of titanium.

8. Method according to claim 1, wherein, at step e), the dies are bonded to the second transfer substrate by direct bonding of a third bonding layer, previously deposited on the surface of the active diode stack opposite to the first transfer substrate, with a fourth bonding layer, previously deposited on the second transfer substrate.

9. Method according to claim 8, wherein the third and fourth bonding layers are made of silicon oxide.

10. Method according to claim 1, wherein, at step g), the portions of the active diode stack and the second transfer substrate are bonded to the active substrate by bonding of a first insulating layer, previously deposited on the surface of the active diode stack opposite to the second transfer substrate, and of first contacting elements, located in the first insulating layer, with respectively a second insulating layer, previously deposited on the active substrate, and of second contacting elements, located in the second insulating layer.

11. Method according to claim 1, further comprising, after step f), a step h) of etching of the dies so as to compensate for a misalignment of the dies with respect to the second transfer substrate.

12. Method according to claim 11, further comprising, after step h), a step i) of deposition of an insulating layer filling gaps laterally extending between the dies and then of removal of portions of the insulating layer located vertically in line with the dies.

13. Method according to claim 1, wherein the growth substrate is made of sapphire.

14. Method according to claim 1, wherein the active diode stack comprises gallium nitride.

15. Method according to claim 1, wherein the active diode stack is a light-emitting diode stack comprising, in the order from the growth substrate, first and second semiconductor layers of opposite conductivity types.

*     *     *     *     *